(12) United States Patent
Kondo

(10) Patent No.: US 7,973,520 B2
(45) Date of Patent: Jul. 5, 2011

(54) PIEZOELECTRIC TRANSFORMER TYPE HIGH-VOLTAGE POWER APPARATUS AND IMAGE FORMING APPARATUS

(75) Inventor: Takashi Kondo, Yokohama (JP)

(73) Assignee: Samsung Electronics Co., Ltd., Suwon-Si (KR)

( * ) Notice: Subject to any disclaimer, the term of this patent is extended or adjusted under 35 U.S.C. 154(b) by 121 days.

(21) Appl. No.: 12/169,879

(22) Filed: Jul. 9, 2008

(65) Prior Publication Data

US 2009/0033303 A1 Feb. 5, 2009

(30) Foreign Application Priority Data

Aug. 1, 2007 (JP) ................................. 2007-200799
Nov. 23, 2007 (KR) ........................ 10-2007-0120340

(51) Int. Cl.
*G05F 1/12* (2006.01)
(52) U.S. Cl. ........................................ 323/247; 323/284
(58) Field of Classification Search .................. 323/247, 323/274, 284, 355, 358; 310/314, 318, 319; 399/37, 44, 66, 88, 89, 154
See application file for complete search history.

(56) References Cited

U.S. PATENT DOCUMENTS

| | | | | | |
|---|---|---|---|---|---|
| 5,678,144 | A | * | 10/1997 | Osaki et al. | 399/167 |
| 5,705,877 | A | * | 1/1998 | Shimada | 310/318 |
| 5,777,425 | A | * | 7/1998 | Ino et al. | 310/359 |
| 5,894,184 | A | * | 4/1999 | Furuhashi et al. | 310/316.01 |
| 5,969,954 | A | * | 10/1999 | Zaitsu | 363/16 |
| 6,028,388 | A | * | 2/2000 | Shimada | 310/318 |
| 6,198,198 | B1 | * | 3/2001 | Fujimura et al. | 310/316.01 |
| 6,427,054 | B1 | * | 7/2002 | Ohkubo et al. | 399/27 |
| 6,720,705 | B2 | * | 4/2004 | Nakatsuka et al. | 310/316.01 |
| 6,853,153 | B2 | * | 2/2005 | Gray | 315/291 |
| 7,062,212 | B2 | * | 6/2006 | Naruse et al. | 399/350 |
| 2004/0095263 | A1 | * | 5/2004 | Thomas | 341/53 |
| 2004/0100592 | A1 | * | 5/2004 | Nakanishi et al. | 349/2 |
| 2007/0018589 | A1 | * | 1/2007 | Saito et al. | 315/209 PZ |
| 2007/0025753 | A1 | * | 2/2007 | Saito et al. | 399/88 |
| 2007/0046144 | A1 | * | 3/2007 | Urano | 310/317 |

\* cited by examiner

*Primary Examiner* — Adolf Berhane
*Assistant Examiner* — Emily Pham
(74) *Attorney, Agent, or Firm* — Staas & Halsey LLP

(57) ABSTRACT

A piezoelectric transformer type high-voltage power source apparatus to control an output voltage from a piezoelectric transformer to a load, and an image forming apparatus including the same, the piezoelectric transformer type high-voltage power source apparatus including: an output voltage detection unit to compare the output voltage with an output control voltage, and to output a digital value according to the comparison; and a driving control unit to control a driving frequency and a duty rate of the piezoelectric transformer according to the digital value. Accordingly, the piezoelectric transformer type high-voltage power source apparatus can stably perform frequency and duty rate control without experiencing an abnormal oscillation or uncontrollable state due to a manufacturing irregularity of particular components and/ or a change in temperature, and a high voltage can be output within a short rise time.

18 Claims, 8 Drawing Sheets

PIEZOELECTRIC TRANSFORMER TYPE HIGH-VOLTAGE POWER APPARATUS AND IMAGE FORMING APPARATUS

CROSS-REFERENCE TO RELATED APPLICATIONS

This application claims the benefit of Japanese Patent Application No. 2007-200799, filed Aug. 1, 2007 in the Japanese Patent Office and Korean Patent Application No. 2007-120340, filed Nov. 23, 2007, in the Korean Intellectual Property Office, the disclosures of which are incorporated herein by reference.

BACKGROUND OF THE INVENTION

1. Field of the Invention

Aspects of the present invention relate to a piezoelectric transformer type high-voltage power source apparatus and an image forming apparatus including the same.

2. Description of the Related Art

In an image forming apparatus that forms an image in an electronic photographing process, a transfer unit contacts a photoreceptor to transfer the image from the photoreceptor to, for example, a print medium according to a direct transfer method. Specifically, the transfer unit is a conductive rubber in the form of a roller having a conductive body as a rotation axis. The driving of the transfer unit is controlled according to a process speed of the photoreceptor. Also, the polarity of a DC bias voltage, which is applied to the transfer unit, is the same as that of a transfer voltage of a corona discharge method.

Thus, in order to perform a reliable transfer using the transfer roller, a voltage of approximately 3 kV (required current is microamperes) is generally applied. According to a conventional technology, in order to generate a high voltage that is required for processing image formation, a coil-type electronic transformer has been used. However, the electronic transformer is formed with copper wire, bobbins, and magnetic cores, and when the electronic transformer is used to apply a voltage of approximately 3 kV, the output current value is very low. Accordingly, a leakage current in each part of the electronic transformer should be minimized. In order to minimize the leakage current, a method of making the coil of an electronic transformer with a mold made of an organic insulating material has been used. However, when this method is used, there are risks of producing smoke and fire, and a bigger electronic transformer in relation to the supplied power is required. Accordingly, it is difficult to reduce the size and weight of the electronic transformer.

In order to solve this problem, a method of generating a high voltage by using a slim-type light-weight high-output piezoelectric transformer has been considered. That is, if a piezoelectric transformer using a ceramic material is employed, it is possible to generate a high voltage with an efficiency greater than or equal to that of the electronic transformer. Furthermore, regardless of whether the primary side and the secondary side are combined, it is possible to space apart the primary side electrode and the secondary side electrode. Therefore, mold processing is not necessary for insulating and there are no longer any risks of producing smoke and fire. As a result, excellent properties that ensure a small-sized and light-weight high-voltage power source apparatus can be obtained.

As such, in a high-voltage power source apparatus using a piezoelectric transformer, a piezoelectric transformer controls an output by using a general frequency. However, in a frequency control performed by a high-voltage power source control circuit, problems (such as a variable width and inefficiency of an output voltage) exist. That is, in order to reduce an output voltage by increasing a frequency, if a frequency is changed too much, an output voltage increases at a next resonant point since a plurality of resonant points exist in a piezoelectric transformer. Accordingly, a variable width of an output voltage cannot be increased. In addition, frequency ranges resulting in high efficiency and low efficiency for generating a driving voltage exist in frequencies of a driving voltage. If a variable width of an output voltage increases, frequencies in a frequency range resulting in low efficiency should be used. Thus, the entire efficiency of the high-voltage power source apparatus is low.

In order to solve this problem, a technology to simultaneously control a frequency and a duty rate of a driving voltage has been suggested. When a frequency and a duty rate of a driving voltage are simultaneously controlled by using the above technology so as to make an output voltage uniform, a low output voltage and an increased variable width can be obtained. Accordingly, a constant voltage power source having excellent stability can be obtained. Also, when ranges resulting in high efficiency of a frequency and a duty rate are combined, efficiency of the high-voltage power source apparatus can be increased.

However, in the above technology, a control circuit to simultaneously control a frequency and a duty rate, which is included in a driving voltage control unit, generates a pyramidal wave by a charge/discharge circuit due to resistance and a capacitor. The frequency and the duty rate are simultaneously controlled based on the pyramidal wave. Accordingly, when a load current significantly increases due to a manufacturing irregularity of particular components and/or a change in temperature, the control circuit may exceed the resonant frequency such that control is impossible. In addition, the driving frequency cannot be used in the vicinity of a resonant frequency, and thus efficiency cannot be improved.

A conventional piezoelectric transformer type high-voltage power source apparatus will now be explained with reference to FIGS. 1 through 3. FIG. 1 is a block diagram to explain a conventional piezoelectric transformer type high-voltage power source apparatus.

Referring to FIG. 1, in the conventional piezoelectric transformer type high-voltage power source apparatus, a piezoelectric transformer T901 is ceramic. Diodes D902 and D903 and a high-voltage capacitor C904 rectify and smooth an alternating current (AC) output of the piezoelectric transformer T901 to form a constant voltage. The rectified and smoothed output voltage is provided to a transfer roller (not shown). Also, resistors R905, R906, and R907 divide the rectified and smoothed output voltage, before the rectified and smoothed output voltage is input to a non-inverted input terminal (+ terminal) of an operational amplifier Q909 through a protection resistor R908.

Meanwhile, an analog control signal Vcont of a high-voltage power source is input from a DC controller through a resistor R914 to an inverted input terminal (− terminal) of the operational amplifier Q909. The operational amplifier Q909, the resistor R914, and a capacitor C913 form an integrator circuit. The operational amplifier Q909 outputs a control signal (Vcont) that is integration-processed with an integration constant determined by the values of the resistor R914 and the capacitor C913.

The output end of the operational amplifier Q909 is connected to a Voltage-Controlled Oscillator (VCO) 910. Furthermore, the output end of the VCO 910 drives a transistor Q911 connected to an inductor L912, thereby providing a power source of a particular driving frequency to the primary side of the piezoelectric transformer T901. In this way, a high-voltage power source unit of an electronic photographing type image forming apparatus uses the piezoelectric transformer T901.

FIGS. 2 and 3 are waveform diagrams to explain a driving frequency of a piezoelectric transformer in a piezoelectric transformer type high-voltage power source apparatus according to a conventional technology. Referring to FIG. 2, a maximum output voltage of a piezoelectric transformer T901 occurs at a resonant frequency f0, and the output voltage decreases on either side of the resonant frequency f0. Accordingly, by controlling a driving frequency, the output voltage can be controlled. When the output voltage of the piezoelectric transformer T901 is to be increased, a driving frequency fx that is higher than the resonant frequency f0 is used as a new resonant frequency f0.

A high-voltage power source unit of an electronic photographing type image forming apparatus has a plurality of high-voltage power source circuits, and forms images with biasing outputs for charging, developing, and transferring. However, since the conventional piezoelectric transformer type high-voltage power source apparatus controls the driving frequency fx of the piezoelectric transformer T901 by processing an analog signal Vcont, as illustrated in FIG. 1, a time delay occurs before a desired output control voltage value is reached.

Also, a plurality of resonant points can exist in a piezoelectric transformer T901. For example, as illustrated in FIG. 3, 4 resonant points may exist in a piezoelectric transformer T901. As illustrated in FIG. 3, a first resonant point exists in which an output voltage of about 3.5 kV can be obtained if a driving voltage with a first resonant frequency f1 is applied. Furthermore, at the higher frequency side of the first resonant frequency f1 are a second resonant point (resonant frequency: f2) and a third resonant point (resonant frequency: f3) that maximize output voltages. Since each of the resonant points are a point at which an output voltage becomes a maximum (as illustrated in FIG. 3), if the frequency of a driving voltage is changed to a frequency either higher or lower than a resonant frequency, the output voltage decreases.

However, even when the frequency is changed from the resonant frequency, if the maximum value of an output voltage is set to kilovolts, the frequency of the output voltage does not reduce to hundreds of volts or less. This is because, if the frequency is changed greatly, the frequency does not converge on 0 as the frequency approaches a next resonant frequency. Therefore, after a certain minimum frequency is reached, the output voltage increases until the next resonant frequency is reached.

In the frequency range of a driving voltage, a range exists within which an output voltage of the piezoelectric transformer T901 may be most efficiently obtained (such as a range in the vicinity of a resonant frequency). However, in order to increase the variable width of an output voltage range, a frequency in a range within which poor efficiency results must also be used. Thus, the efficiency as a whole is lowered.

SUMMARY OF THE INVENTION

Aspects of the present invention provide a piezoelectric transformer type high-voltage power source apparatus and an image forming apparatus including the same that can stably perform frequency control and duty rate control without experiencing an abnormal oscillation or uncontrollable state due to a manufacturing irregularity of particular components and/or a temperature change in a range of wide output voltage values.

Aspects of the present invention also provide a piezoelectric transformer type high-voltage power source apparatus and an image forming apparatus enabling output of a high-voltage within a short rise time.

According to an aspect of the present invention, there is provided a piezoelectric transformer type high-voltage power source apparatus to control an output voltage from a piezoelectric transformer to a load, the apparatus including: an output voltage detection unit to compare the output voltage of the piezoelectric transformer with an output control voltage, and to output a digital value according to the comparison; and a driving control unit to control a driving frequency and a duty rate of the piezoelectric transformer according to the digital value.

According to another aspect of the present invention, there is provided an image forming apparatus including: a charging unit to uniformly charge a surface of a latent image supporter; an exposure unit to form a latent image on the surface of the latent image supporter after charging; a developing unit to develop the latent image; a transfer unit to transfer a toner image formed on the latent image supporter to a transfer material; and a power source apparatus to provide a voltage to at least one of the charging unit, the exposure unit, the developing unit, and the transfer unit, the power source apparatus including an output voltage detection unit to compare the output voltage of the piezoelectric transformer with an output control voltage, and to output a digital value according to the comparison; and a driving control unit to control a driving frequency and a duty rate of the piezoelectric transformer according to the digital value.

According to still another aspect of the present invention, there is provided a piezoelectric transformer type high-voltage power source apparatus, including: a piezoelectric transformer to output an output voltage to a load according to a driving frequency and a duty rate; an output voltage detection unit to compare the output voltage of the piezoelectric transformer with an output control voltage, and to output a digital value according to the comparison; and a driving control unit to control the driving frequency and the duty rate of the piezoelectric transformer according to the digital value.

According to yet another aspect of the present invention, there is provided a method of controlling an output voltage from a piezoelectric transformer to a load, the method including: comparing the output voltage of the piezoelectric transformer with an output control voltage; outputting a digital value according to the comparing; controlling a driving frequency and a duty rate of the piezoelectric transformer according to the digital value.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
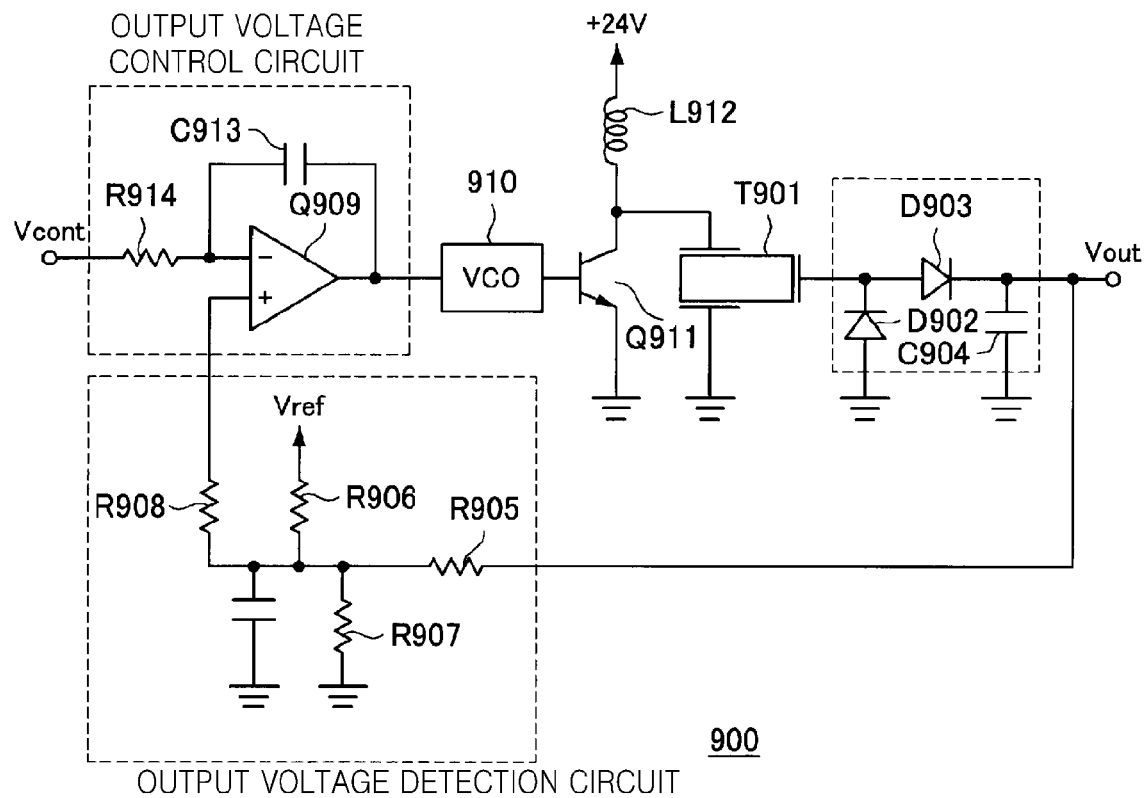
FIG. 1 is a block diagram to explain a conventional piezoelectric transformer type high-voltage power source apparatus.
Figure 2:
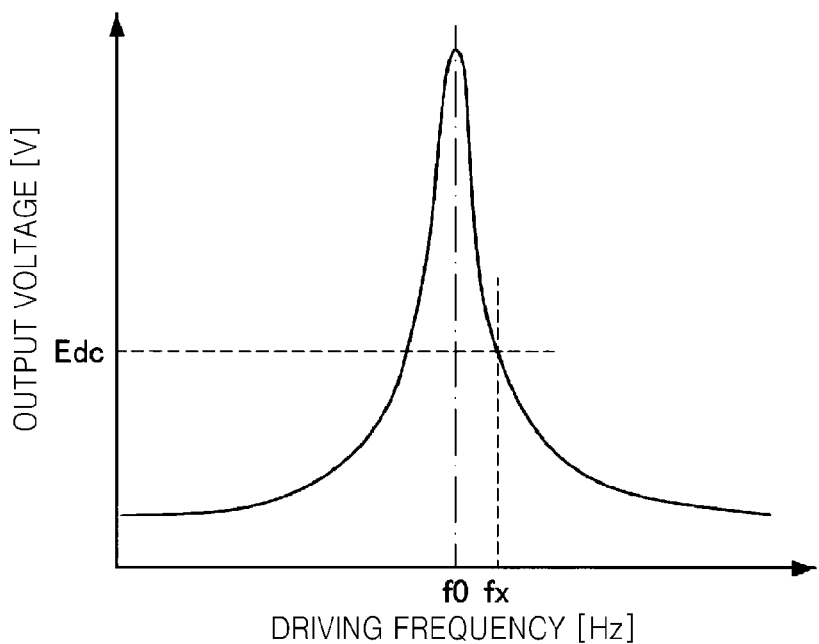
FIG. 2 is a first waveform diagram to explain a driving frequency of a piezoelectric transformer in a piezoelectric transformer type high-voltage power source apparatus according to a conventional technology.
Figure 3:
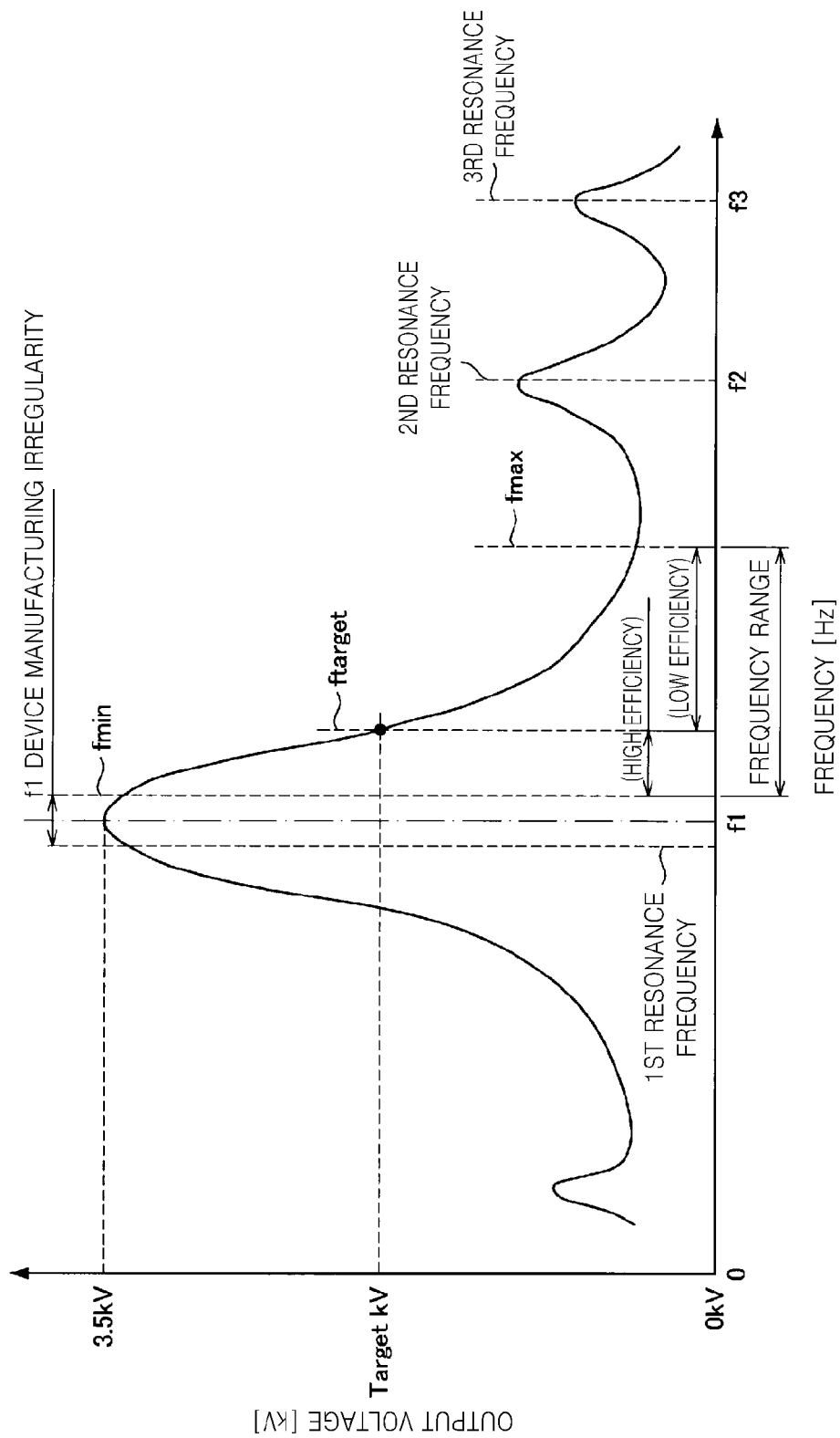
FIG. 3 is a second waveform diagram to explain a driving frequency of a piezoelectric transformer in a piezoelectric transformer type high-voltage power source apparatus according to a conventional technology.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A piezoelectric transformer type high-voltage power source apparatus according to aspects of the present invention controls a driving frequency and a duty rate simultaneously by using digital signal processing. Accordingly, the driving frequency and the duty rate are simultaneously controlled stably and efficiently at a wide range of output voltage values without experiencing an uncontrollable state or having an abnormal oscillation occur due to irregular particular components and temperature changes. As a result, a high-voltage can be output within a short rise time.

Figure 4:
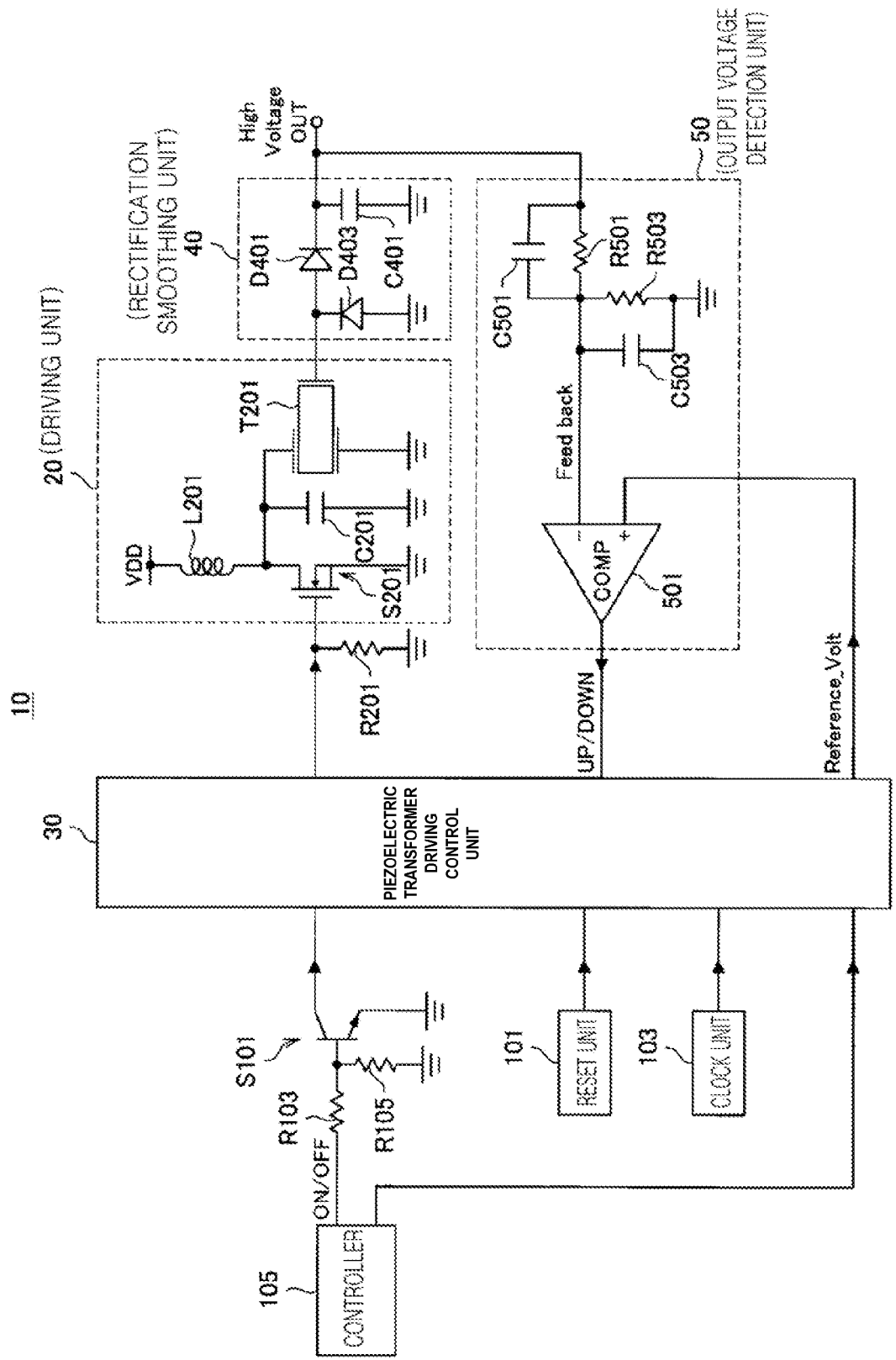
FIG. 4 is a block diagram to explain a piezoelectric transformer type high-voltage power source apparatus according to an embodiment of the present invention.

The piezoelectric transformer type high-voltage power source apparatus according to aspects of the present invention will now be explained with reference to FIGS. 4 through 9. Specifically, the piezoelectric transformer type high-voltage power source apparatus 10 applies a driving voltage controlled by a predetermined driving frequency and a duty rate to a piezoelectric transformer T201 so that an output voltage from the piezoelectric transformer T201 can be provided to a load. FIG. 4 is a block diagram to explain the piezoelectric transformer type high-voltage power source apparatus 10 according to an embodiment of the present invention.

Referring to FIG. 4, the piezoelectric transformer type high-voltage power source apparatus 10 includes a driving unit 20, a piezoelectric transformer driving control unit 30, a rectification smoothing unit 40, and an output voltage detection unit 50.

The driving unit 20 includes a piezoelectric transformer T201, an inductor L201, a resistor R201, and a switching device S201 of a metal-oxide-semiconductor field-effect transistor (MOSFET) or a transistor.

If a power source VDD is connected to the inductor L201, a driving voltage that is frequency-controlled by the piezoelectric transformer driving control unit 30 is input to the switching device S201. The input driving voltage controls an on/off state of the switching device S201, thereby raising the applied power source voltage or converting to a pseudo sine wave. Then, the converted power source voltage is applied to the piezoelectric transformer T201.

The piezoelectric transformer T201 has a piezoelectric vibrating body including a primary electrode and a secondary electrode. The primary side is polarized in the width direction and the polarized ends face each other with the piezoelectric vibrating body disposed therebetween. The secondary side is polarized in a lengthwise direction. The primary electrode and the secondary electrode may be provided in a resin case (not shown). Furthermore, the piezoelectric vibrating body may be composed of piezoelectric ceramic (such as plumbum-zirconate-titanate (PZT)), and may have a plate shape. In the length direction of the piezoelectric vibrating body, the first electrode is disposed from one end to, for example, the middle of the piezoelectric vibrating body. The secondary electrode is disposed at the other end. If a driving voltage having a proper resonant frequency that is determined by a length measure is applied to the primary side, a strong mechanical resonance is induced due to an inverse piezoelectric effect, and a high output voltage corresponding to the vibration is output due to a piezoelectric effect.

FIGS. 6A through 6C are diagrams illustrating a relationship between an inductor power source voltage and an operational waveform appearing when a voltage is raised in a piezoelectric transformer type high-voltage power source apparatus according to an embodiment of the present invention.

The operation when a power source voltage is raised will now be explained in detail with reference to FIGS. 4 and 6A through 6C. Referring to FIG. 6B, if a driving voltage is applied to the switching device S201, the switching device S201 switches to an ON state, and a current flows through the inductor L201. In this case, if it assumed that the time in which a driving voltage is applied is ON Time and the time in which a driving voltage is not applied is OFF time in FIG. 6B, the current corresponds to the driving voltage ON Time. Also, the current flowing through the switching device S201 is determined according to the ON time, and when the current flows, energy is accumulated in the inductor L201.

If the switching device S201 switches to an OFF state, a resonance is induced between the capacitor C201 and the inductor L201 connected to the primary side of the piezoelectric transformer T201. When such a resonance is induced, a voltage applied to the piezoelectric transformer T201 is a driving voltage of the piezoelectric transformer T201 (illustrated in FIG. 6A), and the magnitude of the voltage increases according to the amount of energy accumulated in the inductor L201. Accordingly, as the ON time increases, the output voltage output after increasing the driving voltage applied to the piezoelectric transformer T201 increases.

In general, if a duty rate increases, an output efficiency of the piezoelectric transformer T201 also increases. Accordingly, since a driving frequency and a duty rate are controlled simultaneously, control of an output voltage becomes easier due to a higher efficiency of increased output voltage of the piezoelectric transformer T201. In addition, while the OFF time is fixed in FIGS. 6A through 6C, it is understood that aspects of the present invention are not limited thereto, and the OFF Time may also vary.

Referring back to FIG. 4, the piezoelectric transformer driving control unit 30 controls the frequency of the driving voltage controlling the piezoelectric transformer T201 and the duty rate according to digital changing values input from the output voltage detection unit 50. The piezoelectric transformer type high-voltage power source apparatus 10 is characterized by the fact that the driving frequency of the piezoelectric transformer T201 is controlled by digital signal processing performed by the piezoelectric transformer driving control unit 30. Such a piezoelectric transformer driving control unit 30 will be explained later in more detail.

The rectification smoothing unit 40 includes a capacitor C401 and diodes D401 and D403. The alternating current (AC) output of the piezoelectric transformer T201 is rectified and smoothed to a constant voltage (DC voltage) by the diodes D401 and D403 and the capacitor C401, and is provided to a load (for example, a transfer roller).

The output voltage detection unit 50 detects changes of an output voltage as a digital changing value. Specifically, the output voltage detection unit 50 compares an output voltage of the piezoelectric transformer T201 to an output controlling voltage for maintaining a constant output voltage. To do so, the output voltage detection unit 50 includes capacitors C501 and C503, resistors R501 and R503, and a comparator (COMP) 501. The output voltage that is rectified and smoothed to a DC voltage by the rectification smoothing unit 40 is divided by the voltage divider resistors R501 and R503 in the output voltage detection unit 50. The output voltage is then input to an inverted input terminal (− terminal) of the comparator 501 as an error detection voltage (Feedback). In this case, the capacitors C501 and C503 connected in parallel to the voltage divider resistors R501 and R503, respectively, adjust the AC and DC components of the output voltage. Also, an output controlling voltage, which is a DC voltage to control an output voltage, is input as a reference voltage Reference_Volt to the non-inverted input terminal (+ terminal) of the comparator 501.

The comparator 501 compares the magnitudes of the output voltage Reference_Volt and the error detection voltage Feedback input to the non-inverted input terminal (+ terminal) and the inverted input terminal (− terminal), respectively, and outputs the comparison result as a digital changing value. If the output voltage Feedback is greater than the reference output voltage Reference_Volt, the output of the comparator 501 is at a "low" logic level, and if the output voltage Feedback is less than the output voltage Reference_Volt, the output of the comparator 501 is at the "high" logic level. According to aspects of the present invention, an analog change in the output voltage from an output terminal can be represented by a digital changing value output from the comparator 501. The digital changing value is a control signal UP/DOWN input to the piezoelectric transformer driving control unit 30 to control a frequency control unit thereof.

Also, the piezoelectric transformer type high-voltage power source apparatus 10 further includes a reset unit 101 providing a reset signal, a clock unit 103 providing a clock signal, and a controller 105 providing a driving control signal ON/OFF to the piezoelectric transformer T201.

The driving control signal (ON/OFF signal) provided from the controller 105 is inverted by the resistors R103 and R105 and the switching device S101 and is converted to an open collector output so as to be input to the piezoelectric transformer driving control unit 30.

Figure 5:
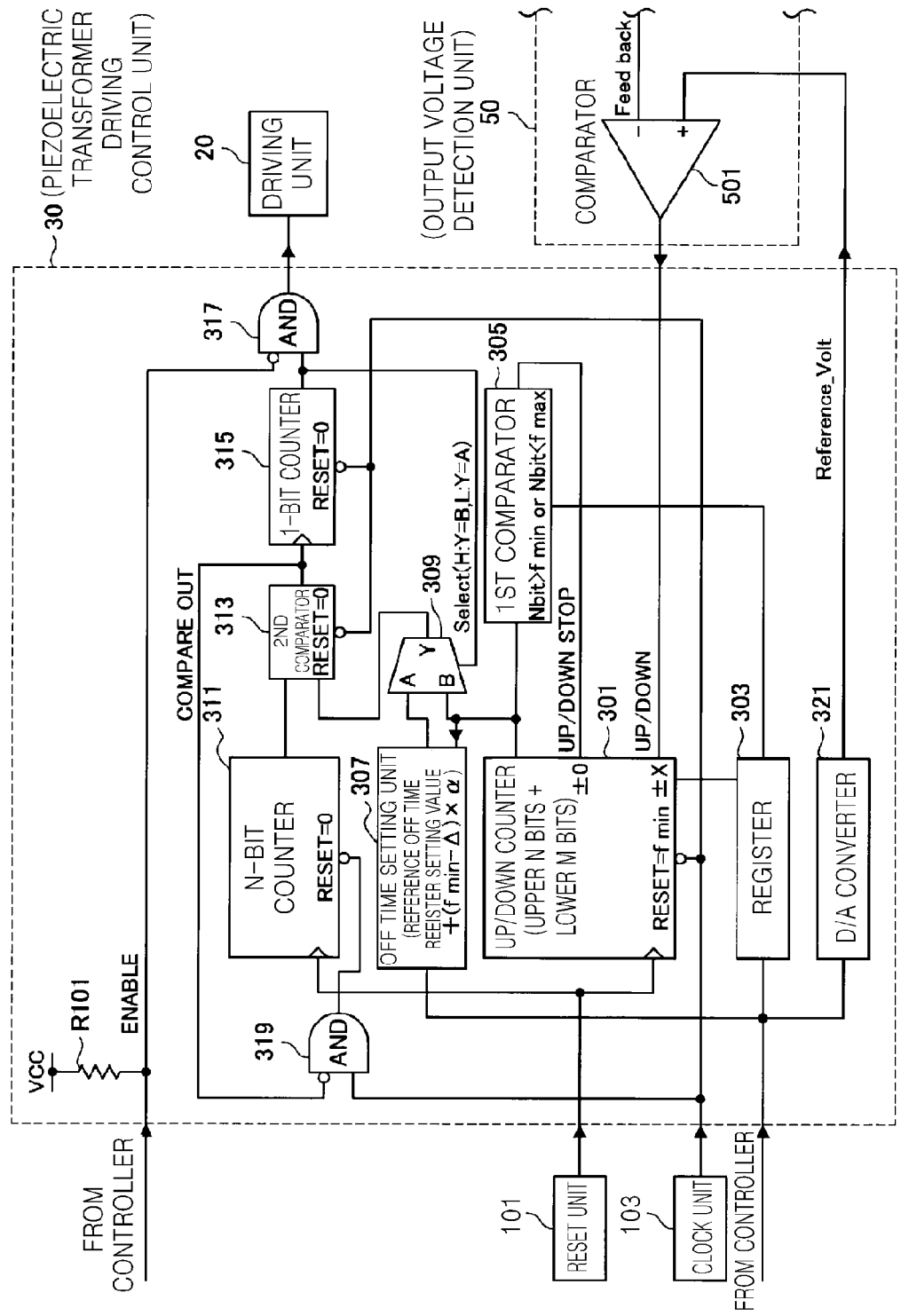
FIG. 5 is a block diagram to explain a piezoelectric transformer driving control unit of a piezoelectric transformer type high-voltage power source apparatus according to an embodiment of the present invention.
Figure 6:
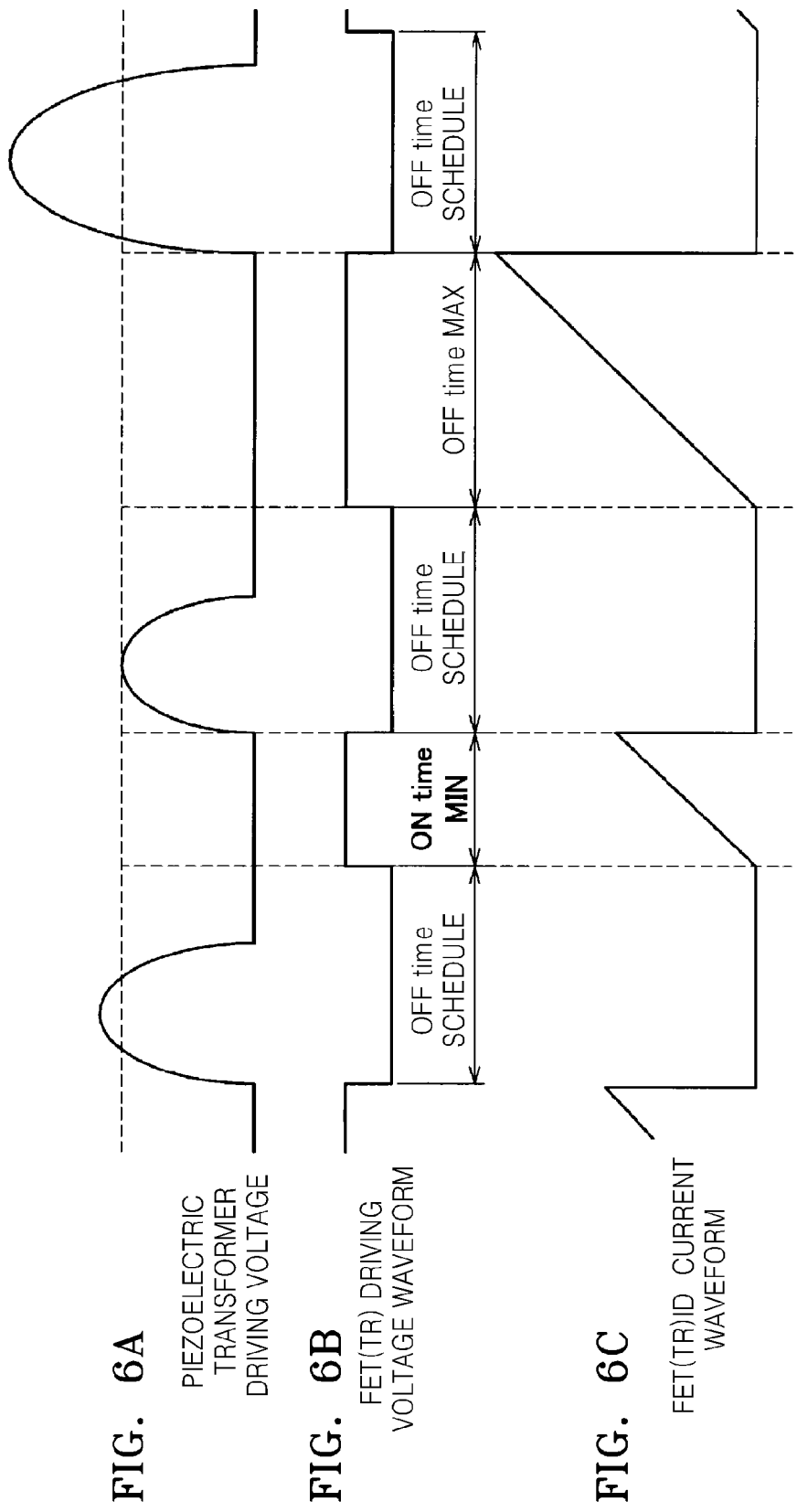
FIGS. 6A through 6C are diagrams illustrating a relationship between an inductor power source voltage and an operational waveform appearing when a voltage is raised in a piezoelectric transformer type high-voltage power source apparatus according to an embodiment of the present invention.

FIG. 5 is a block diagram to explain a piezoelectric transformer driving control unit 30 of a piezoelectric transformer type high-voltage power source apparatus 10 according to an embodiment of the present invention. Referring to FIG. 5, the piezoelectric transformer driving control unit 30 includes a driving frequency control unit, an off time setting unit 307, a selection unit 309, and a driving voltage generation unit.

The driving frequency control unit variably controls the driving frequency of the piezoelectric transformer T201 according to the digital changing value (UP/DOWN signal) output from the output voltage detection unit 50. The driving frequency control unit includes an up/down counter 301, a register 303, and a first comparator 305.

The clock unit 103 provides a high-speed clock signal generated according to a required frequency control precision degree to the up/down counter 301. When the clock signal is at the "high" logic level and the control signal UP/DOWN from the output voltage detection unit 50 is at the "high" logic level, a counter value is increased by X. When the clock signal is at the "high" level and if the control signal UP/DOWN is at the "low" logic level, the counter value is decreased by X. Also, the number of bits of the frequency control counter may be set according to a sum of the number of bits of the driving voltage generation counter (N) and low order M bits (i.e., N+M) by setting the low order M bit value. Accordingly, a gain of the error feedback voltage Feedback may be corrected and a stable control may be enabled. Even when the magnitudes of the output voltage Feedback and the output control voltage Reference_Volt are similar to each other and the change in the counter value of the up/down counter 301 becomes very small, if the number of bits of the frequency control counter is set to be (N+M), the high order N bits do not change even when the low order M bits change. Accordingly, counting can be performed stably.

Here, the counter up/down value X is a register value that may be a fixed value or may be freely set (for example, by an external controller) in order to correct a gain of the error feedback voltage Feedback. The set value of the counter up/down value X is stored in the register 303 and is referred to by the up/down counter 301 whenever necessary.

Figure 7:
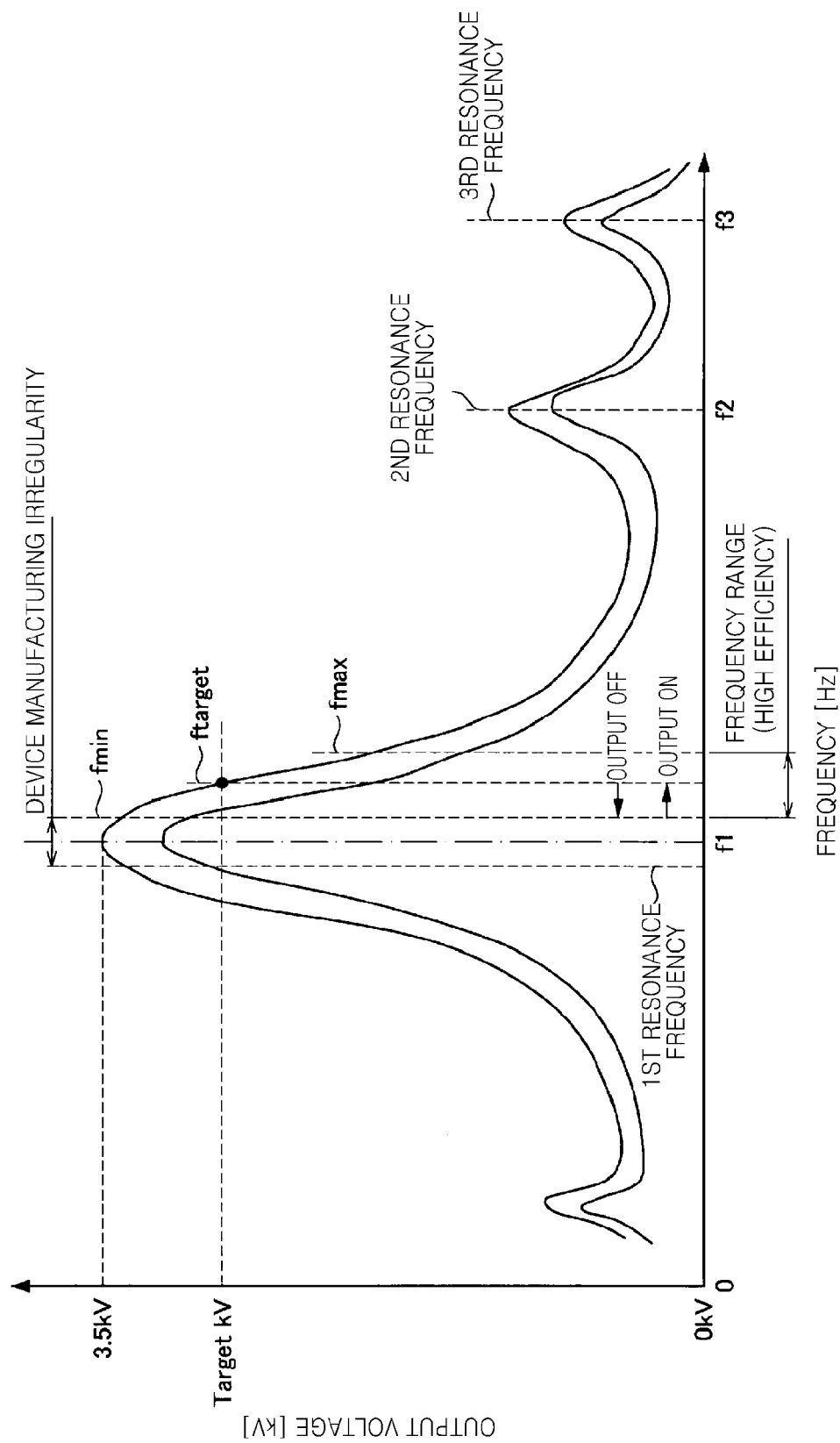
FIG. 7 is a waveform diagram to explain a driving frequency of a piezoelectric transformer in a piezoelectric transformer type high-voltage power source apparatus according to an embodiment of the present invention.

FIG. 7 is a waveform diagram to explain a driving frequency of a piezoelectric transformer T201 in a piezoelectric transformer type high-voltage power source apparatus 10 according to an embodiment of the present invention. Referring to FIG. 7, the output voltage varies with respect to the frequency of a driving voltage applied to the piezoelectric transformer T201. The output voltage of the piezoelectric transformer T201 has three extreme values (resonant points) as illustrated in FIG. 7. In the vicinity of a first resonant frequency f1 at the low frequency side, the highest output voltage is given. As the frequency moves toward a second resonant frequency f2 and a third resonant frequency f3 at the high frequency side, the value of the output voltage decreases. Accordingly, in order to more efficiently obtain an output voltage of the piezoelectric transformer T201, a driving frequency in the vicinity of the first resonant frequency f1 may be used.

Therefore, a counter value of the up/down counter 301 that is used to control a frequency converges on the frequency range illustrated in FIG. 7. The frequency range can be obtained by taking a frequency value in which manufacturing irregularity of the first resonant frequency f1 is reflected (f_min) as a minimum frequency, and a frequency value immediately before the output voltage curve goes up between the first resonant frequency f1 and the second resonant frequency f2 (f_max) as a maximum frequency. In this case, f_min and f_max are register values stored in the register 303, and may be fixed or set by an external controller.

The high order N bits of the counter value are output to the first comparator 305, the off time setting unit 307, and the selection unit 309. Whenever a clock signal from the clock unit 103 is input, the counter value of the up/down counter 301 is compared to the f_min register value and the f_max register value by the first comparator 305. If the comparison indicates that the counter value of the up/down counter 301 is a boundary value of a frequency range, a control signal from the first comparator 305 is output to the up/down counter 301 to stop a count up/down operation of the up/down counter 301.

Furthermore, when the counter value is input from the up/down counter 301 and the register value for setting the off time is input from the off time setting unit 307, the selection unit 309 selects any one of the input values so as to control the duty rate. Moreover, if a reset signal is provided to the up/down counter 301 from the reset unit 101, the up/down counter 301 sets the counter value to f_min.

Accordingly, if the comparison of the output control voltage Reference_Volt, which is a DC voltage, to the output voltage Feedback indicates that the output voltage Feedback is higher, the counter value of the up/down counter 301 decreases, the driving voltage frequency increases, the duty rate decreases, and the output voltage Feedback output from the piezoelectric transformer T201 decreases. Meanwhile, if the output voltage Feedback is lower than the output control voltage Reference_Volt, the counter value of the frequency control up/down counter 301 increases, the driving voltage frequency decreases, the duty rate increases, and the output voltage from the piezoelectric transformer T201 increases. As a result, the output voltage value is maintained at a desired driving voltage frequency (f_target in FIG. 7). That is, the output voltage value is maintained constant relative to the output control voltage Reference_Volt by simultaneously controlling the driving frequency and the duty rate.

Also, when the output is in an OFF state, the output control voltage Reference_Volt becomes greater than the output voltage Feedback. Therefore, the driving frequency gradually decreases to f_min and then stops. Here, the duty rate is at a maximum. Meanwhile, when the output is in an ON state, the output control voltage Reference_Volt becomes less than the output voltage Feedback. In this case, the driving frequency gradually increases to be a target frequency (f_target in FIG. 7). Here, the duty rate is at a minimum.

The register 303 is a changing range memory unit that stores the maximum value (f_max) and the minimum value (f_min) of the driving frequency of the piezoelectric transformer T201. Furthermore, the register 303 stores a counter up/down value X of the up/down counter 301. The register 303 outputs the counter up/down value X to the up/down counter 301 and/or outputs f_max or f_min to the first comparator 305.

The first comparator 305 is a frequency range control unit that controls a changing of the driving frequency within a frequency changing range based on the frequency changing range stored in the register 303 and the output value from the up/down counter 301. More specifically, the high order N bits of the counter value of the up/down counter 301, f_max, and f_min are input to the first comparator 305. The first comparator 305 compares magnitudes of the counter value with f_max and f_min, and thereby determines whether an input counter value is the same as a value on a boundary of the frequency range of the piezoelectric transformer T201. If the high order N bits of the counter value are greater than the minimum value (f_min) of the frequency range, or less than the maximum value (f_max), the first comparator 305 outputs a "high" logic level, and transmits an up/down stop signal. The up/down stop signal is a control signal to stop the count up/down operation of the up/down counter 301.

The off time setting unit 307 sets the off time that stops the driving voltage from being applied to the piezoelectric transformer T201. More specifically, the off time setting unit 307 memorizes a register value for setting a standard off time. The standard off time is a standard value for setting the off time in which a driving voltage is output as a low output voltage. The off time setting unit 307 includes an off time processing unit (not shown), which sets the register value for setting the standard off time based on the output value from the up/down counter 301. Here, the register value for setting the standard off time may be set by an external controller.

Furthermore, the off time setting unit 307 also sets the off time to be a variable value or a fixed value. The register value for setting the standard off time may be output according to Equation 1:

$$\text{register value setting the off time} = \text{register value setting the standard off time} + (f\_min - A) \times \alpha,$$ [Equation 1]

where $0 \leq 60 < 1$, A is an output value of the N bits up/down counter 301, and f_min is input from the register 303.

In Equation 1, when $\alpha=0$, the register value for setting the off time is equal to the register value for setting the standard off time. Thus, the off time setting unit 307 can fix the off time. When $0<\alpha<1$, the register value for setting the off time can be set as a variable value having a variable width of $(f\_min - A) \times \alpha$.

The selection unit 309 selects the output value from the driving frequency control unit and the output value from the off time setting unit 307 according to the output value from the driving voltage generation unit and outputs the selected output value to the driving voltage generation unit.

A counter value (upper N bits) from the up/down counter 301 is input to the selection unit 309 and the register value for setting the off time is input from the off time setting unit 307. In addition, when an output of a 1-bit counter 315 is a high output (i.e., when the driving voltage is high), the selection unit 309 selects the counter value (upper N bits) of the up/down counter 301. When an output of the 1-bit counter 315 is a low output (i.e., when the driving voltage is low), the selection unit 309 selects the register value for setting the off time. Furthermore, the selection unit 309 outputs the selected output values to a second comparator 313.

The driving voltage generation unit generates a driving voltage of the piezoelectric transformer T201 based on the driving frequency controlled by the driving frequency control unit, the off time set by the off time setting unit 307, and the output value of the selection unit 309. As illustrated in FIG. 5, the driving voltage generation unit includes an N-bit digital reset counter 311, the second comparator 313, the 1-bit counter 315, and AND gates 317 and 319.

For synchronization with the up/down counter 301, the N-bit digital reset counter 311 (hereinafter referred to as an N-bit counter 311) has the same high-speed clock input from the clock unit 103 as the up/down counter 301. Whenever the clock signal is at the "high" logic level, the counter value is increased by 1. The counter value of the N-bit counter 311 is output to the second comparator 313.

Also, if a "low" logic level signal is input to the reset input terminal of the N-bit counter 311, the N-bit counter 311 is reset and the counter value becomes 0. The reset signal input to the N-bit counter 311 is generated by performing an AND operation in the AND gate 319 of a system reset signal provided from the reset unit 101 and an inverted version of the output signal (COMPARE_OUT) of the second comparator 313. The system reset signal initializes all logic circuits when power is turned on.

The output value of the selection unit 309 and the counter value of the N-bit counter 311 are input to the second comparator 313. The output value of the selection unit 309 is the counter value of the up/down counter 301 that controls the frequency or any one of the register values for setting the off time set by the off time setting unit 307. The counter value of the N-bit counter 311 is a counter value for generating the driving voltage After these values are input in the second comparator 313, when the output of the 1-bit counter 315 is high (i.e., when the driving voltage output is high), the second comparator 313 compares the counter value of the up/down counter 301 selected by the selection unit 309 with the counter value of the N-bit counter 311. Accordingly, if both counter values are the same, a "high" logic level is output. Conversely, when the output of the 1-bit counter 315 is low (i.e., when the driving voltage output is low), the second comparator 313 compares the register value setting the off time selected by the selection unit 309 with the N-bit counter value. Accordingly, if both counter values are the same, a "high" logic level is output.

Therefore, the driving frequency can be controlled by the counter value of the up/down counter 301. Furthermore, the on time in which the driving voltage output is high can be controlled by the counter value of the up/down counter 301, the off time can be controlled by the register value setting the off time, and the duty rate can be controlled by changing the timing of when the value is selected by the selection unit 309, where the converted timing corresponds to the reset timing of the N-bit counter 311.

In addition, when the counter value of the N-bit counter 311 is above the output value of the selection unit 309, the second comparator 313 is at the "high" logic level. If a reset signal from the reset unit 101 is provided to the second comparator 313, the second comparator 313 is reset.

The 1-bit counter 315 is triggered by the output signal of the second comparator 313. Whenever the output of the second comparator 313 is at the "high" logic level, the output voltage from the output terminal is inverted. The output signal of the 1-bit counter 315 is input to the AND gate 317. Also, the 1-bit counter 315 is reset if a reset signal from the reset unit 101 is input.

In addition, the output signal of the 1-bit counter 315 is also input to the selection unit 309. As described above, if the output of the 1-bit counter 315 is at the "high" logic level, the selection unit 309 selects the counter value of the up/down counter 301. If the output value of the 1-bit counter 315 is at the "low" logic level, the selection unit 309 selects the register value for setting the off time. That is, the value selected by the selection unit 309 at the timing when the "high" logic level and the "low" logic level of the driving voltage is inverted from among the counter value of the up/down counter 301 that controls the on time and the register value for setting the off time. Accordingly, the driving voltage can be applied to the piezoelectric transformer T201 or the timing that stops the driving voltage from being applied to the piezoelectric transformer T201 can be controlled due to the operations of the 1-bit counter 315 and the selection unit 309, thereby controlling the duty rate of the driving voltage.

An inverted version of an ENABLE signal (i.e., an on/off control signal output from the controller 105) and an output signal from the 1-bit counter 315 are input to the AND gate 317. According to the result of the operation of the AND gate 317, on/off control of the high-voltage power source output is performed. That is, if the ENABLE signal is made to be at the "low" logic level, the driving voltage is output from the AND gate 317 without being inverted, and a high-voltage power source output is output. Conversely, if the ENABLE signal is made to be at the "high" logic level, the output of the AND gate 317 is forced to be at the "low" logic level, and output of a high-voltage is stopped. When the high-voltage output is stopped, the driving frequency control unit controls the f_min of the driving frequency and the duty rate to be at a maximum so as to maximize the output voltage.

A reset signal from the reset unit 101 and an inverted version of the output signal (COMPARE_OUT) of the second comparator 313 are input to the AND gate 319, and a reset signal of the N-bit counter 311 is generated. The output of the AND gate 319 is input to the reset terminal of the N-bit counter 311.

Also, the piezoelectric transformer driving control unit 30 includes a D/A converter 321 that converts the output signal of the controller 105 into an analog signal to generate the output control voltage Reference_Volt. It is understood that the D/A converter 321 is not limited to a specific type. For example, a commonly used D/A converter can be employed as the D/A converter 321. Furthermore, a pulse width modulation (MWM) signal generator may be used instead of the D/A converter 321. The output control voltage Reference_Volt generated by the conversion process of the D/A converter 321 is input to the comparator 501 of the output voltage detection unit 50.

Each element of the high-voltage power source apparatus 10 described above may be formed by using general-purpose modules or circuits, or may also be formed by using hardware customized to the function of each element. Accordingly, the structure of the high-voltage power source apparatus 10 can be modified appropriately according to the required technology level.

Figure 8:
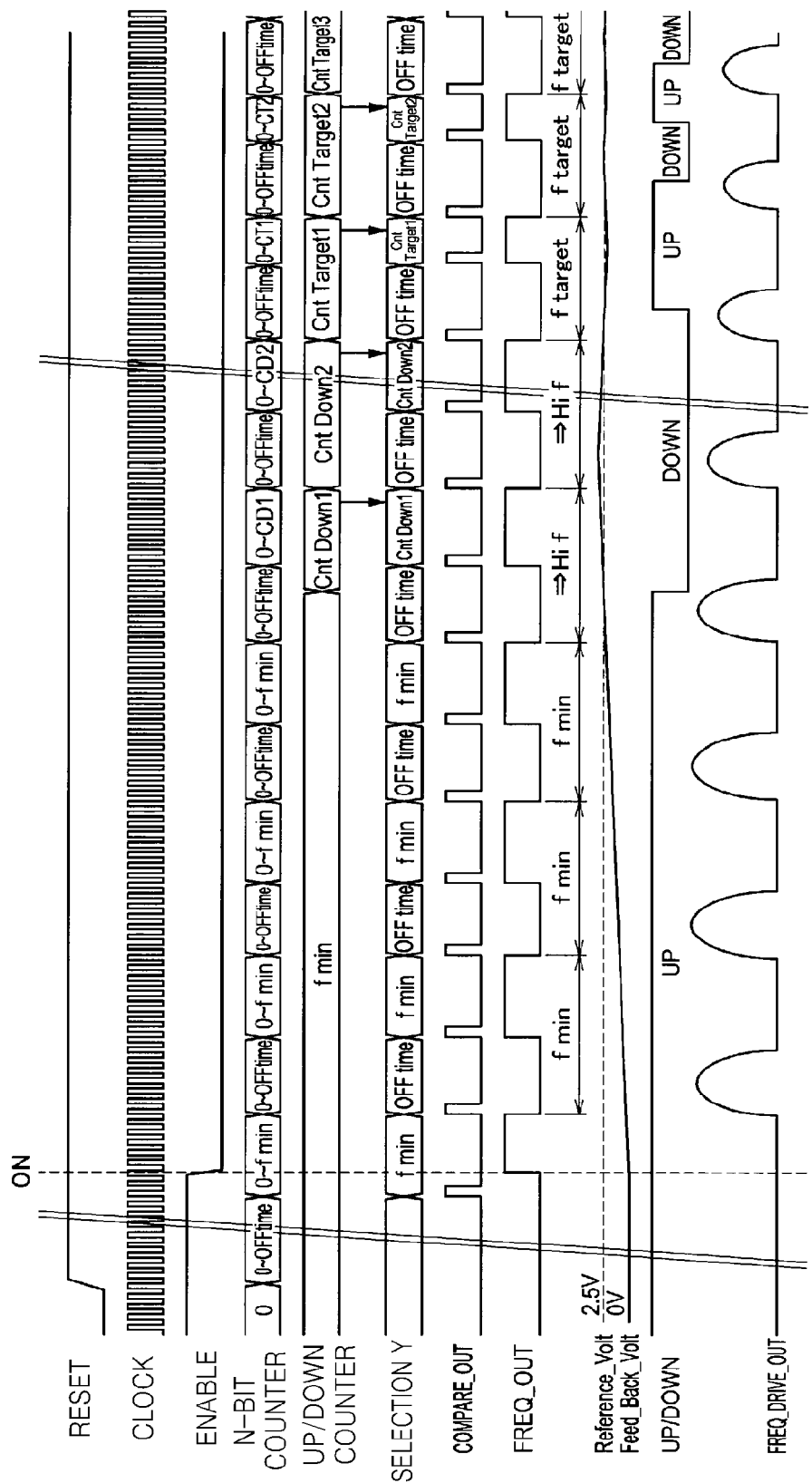
FIG. 8 is a timing diagram illustrating the operation of a piezoelectric transformer type high-voltage power source apparatus according to an embodiment of the present invention.
Figure 9:
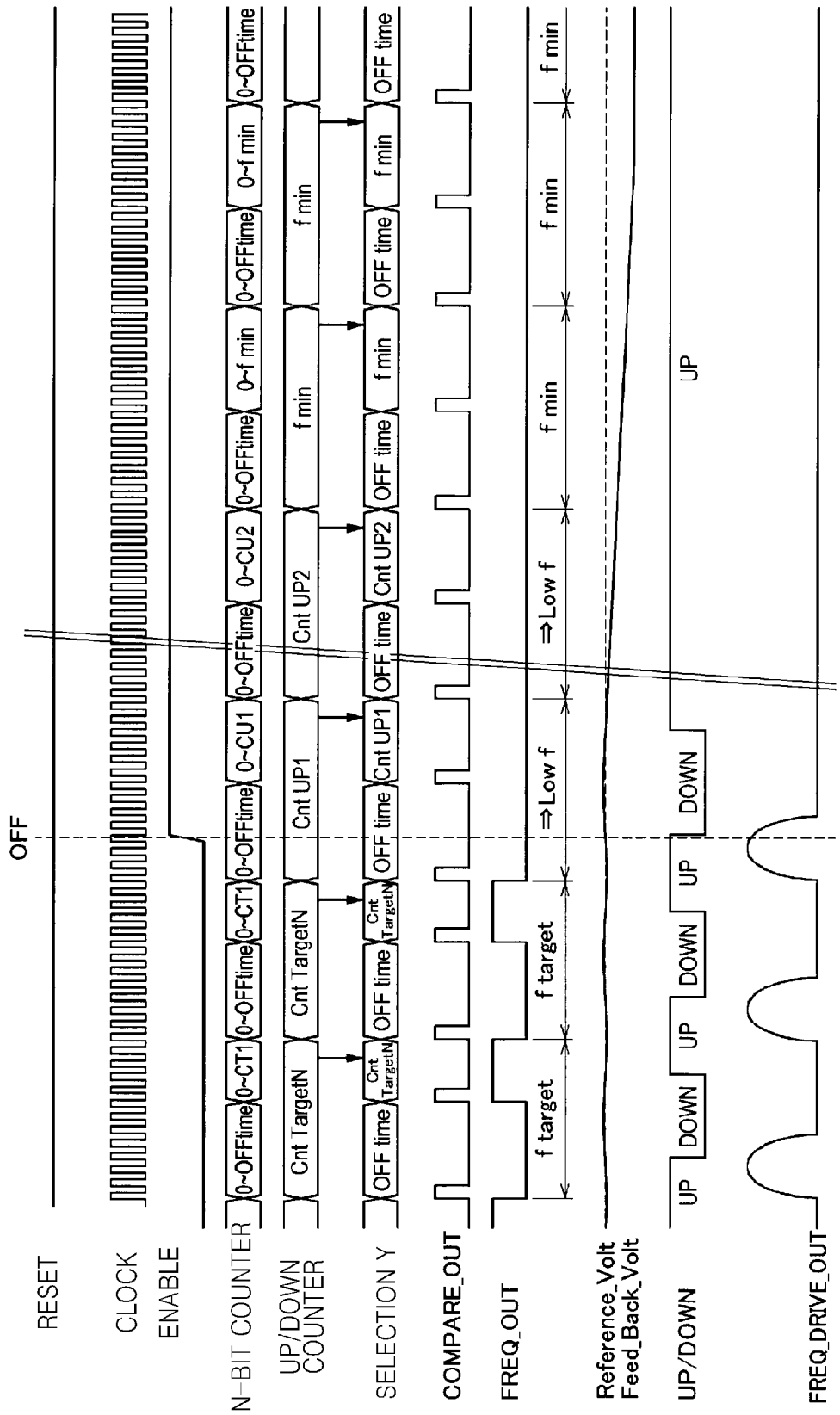
FIG. 9 is a timing diagram of a piezoelectric transformer type high-voltage power source apparatus according to an embodiment of the present invention when operation is stopped.

FIG. 8 is a timing diagram illustrating the operation of a piezoelectric transformer type high-voltage power source apparatus 10 according to an embodiment of the present invention . FIG. 9 is a timing diagram of a piezoelectric transformer type high-voltage power source apparatus 10 according to an embodiment of the present invention when operation is stopped. It is assumed that the register value for setting the off time is fixed (a=0) in FIGS. 8 and 9, although aspects of the present invention are not limited thereto.

An operation of the piezoelectric transformer type high-voltage power source apparatus 10 according to aspects of the present invention will now be explained in detail with reference to FIGS. 8 and 9. FIG. 8 illustrates a control operation timing chart in a period from a high-voltage output ready state to a target high-voltage output (i.e., from an off state to an on state and then to a target high-voltage output). In the ready state, as illustrated in FIG. 8, since the output control voltage Reference_Volt is greater than the output voltage Feedback, the driving frequency (FREQ_OUT) is f_min. In addition, whenever the output signal COMPARE_OUT is at the "high" logic level, the output value Y of the selection unit 309 converts the output value selected from among the counter value of the up/down counter 301 and the register value for setting the off time (Off Time). If ENABLE is at the "low" logic level and the apparatus 10 is in an ON state, the output voltage Feed_Back_Volt gradually increases and UP is input as an up/down signal into the up/down counter 301. Also, if the output voltage Feed_Back_Volt is greater than the output control voltage Reference_Volt, DOWN is output as an up/down signal, and the up/down counter 301 decreases the counter value. In FIG. 8, Cnt Down indicates count-down decreasing the counter value. Also, CD1 in the N-bit counter 311 indicates Cut Down 1 and the counter value is Cnt Down1>Cnt Down2.

Since it is assumed that the register value for setting the off time is fixed in FIG. 8, when the counter value of the up/down counter 301 decreases, the length of time that the driving frequency FREQ_OUT is at the "high" logic level is shorter. Thus, the duty rate decreases. Accordingly, the driving frequency moves to a high frequency side.

In FIG. 8, Hi f indicates that the driving frequency moves to the high frequency side. As such, as the on time is shorter, the duty rate decreases. Furthermore, as the driving frequency increases, the output power FREQ_DRIVE_OUT decreases.

As described above, the driving frequency FREQ_OUT moves toward the high frequency side and is controlled to be a target driving frequency f_target. In FIG. 8, Cnt target 1 in the up/down counter 301 indicates that the driving frequency is counted until f_target and CT1 in the N-bit counter 311 indicates Cnt target 1.

FIG. 9 illustrates a control operation timing chart in a period from a target high-voltage output to a high-voltage output ready state (i.e., from a target high-voltage output to an off state and then to a high-voltage output ready state). As illustrated in FIG. 9, in a state in which a target high-voltage is output, the N-bit counter 311 and the up/down counter 301 continue to count until the counter value becomes f_target (ft), and the output voltage Feed_Back_Volt becomes similar to the output control voltage Reference_Volt. Here, if ENABLE is at the "high" logic level and the apparatus 10 is in an OFF state, the value of the output voltage Feed_Back_Volt gradually decreases and the value of the output control voltage Reference_Volt increases. As a result, UP is output as an up/down signal, and therefore the up/down counter 301 increases the counter value. In FIG. 9, CntUp indicates count-up increasing the counter value.

Since it is assumed that the register value for setting the off time is fixed in FIG. 9, when the up/down counter value increases, the time that the driving frequency FREQ_OUT is at the "high" logic level is longer. Thus, the duty rate increases. Accordingly, the driving frequency moves to a low frequency side. In FIG. 9, Low f indicates that the driving frequency moves toward the low frequency side.

As illustrated in FIG. 9, if the counter value of the up/down counter 301 increases, the upper limit value of the count value of the N-bit counter 311 also increases accordingly. As a result, the driving frequency FREQ_OUT moves from f_target toward the low frequency side until f_min is reached, which is a frequency at which a maximum output voltage occurs.

An image forming apparatus using the piezoelectric transformer type high-voltage power source apparatus 10 according to aspects of the present invention will now be explained.

The image forming apparatus includes a charging unit to charge a surface of a latent image supporter, an exposure unit to form a latent image on the surface of the latent image supporter after charging, a developing unit to develop the latent image, and a transfer unit to transfer a toner image formed on the latent image supporter to a transfer material.

In this case, the charging unit, the developing unit, and the transfer unit are provided with a predetermined bias (voltage) from a power source apparatus set in the image forming apparatus. Accordingly, the image forming apparatus employs the piezoelectric transformer type high-voltage power source apparatus 10 according to aspects of the present invention as a power source apparatus for providing a voltage to at least one of the charging unit, the developing unit and the transfer unit (for example, just the charging unit, or the charging unit and the developing unit).

Since the piezoelectric transformer type high-voltage power source apparatus 10 can stably perform frequency control without experiencing an abnormal oscillation or an uncontrollable state, the charging unit, the developing unit and the transfer unit of the image forming apparatus using the piezoelectric transformer type high-voltage power source apparatus 10 can stably operate. Also, since a high-voltage can be output within a short rise time, the time required for each processing process can be reduced.

As described above, in the piezoelectric transformer type high-voltage power source apparatus 10 according to aspects of the present invention, the driving voltage generation unit of the piezoelectric transformer T201 includes an N-bit counter 311, which is a reset counter, and the frequency control unit includes a digital processing circuit by an up/down counter 301. Also, the changing control range of the frequency changing control up/down counter 301 can be set by a minimum frequency range setting register (f_min) and a maximum frequency range setting register (f_max). Accordingly, in the wide frequency range of the output voltage, the frequency and the duty rate can be controlled stably without the driving voltage experiencing an abnormal oscillation or an uncontrollable state due to a manufacturing irregularity of particular components and/or a change in temperature.

Also, in the piezoelectric transformer type high-voltage power source apparatus 10 according to aspects of the present invention, when the output is made to be in an OFF state by an external ON/OFF control signal, the piezoelectric transformer driving control unit 30 controls the frequency to become a minimum frequency that may vary (f_min) and at which a high-voltage output value becomes a maximum value. Accordingly, when the output is in an ON state, output of a high-voltage within a short rise is enabled.

Furthermore, by forming the piezoelectric transformer driving control unit 30 with a logic circuit, it can be mounted on a conventional application-specific integrated circuit (ASIC), and cost of the frequency control unit can be lowered.

It is understood that aspects of the present invention are not limited to the embodiments described above. For example, although control of a constant voltage is described above by detecting a change in an output voltage and making the voltage value constant, control of a constant current may be performed instead of the constant voltage control. In this case, a change in an output current is detected and the current value is made to be constant. Even when this constant current control is performed, the operation will be the same as that of the constant voltage control.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A piezoelectric transformer type high-voltage power source apparatus to control an output voltage from a piezoelectric transformer to a load, the apparatus comprising:
    an output voltage detection unit to compare the output voltage of the piezoelectric transformer with an output control voltage, and to output a digital value according to the comparison; and
    a driving control unit to control a driving frequency and a duty rate of the piezoelectric transformer according to the digital value, wherein the driving control unit comprises:
a driving frequency control unit to control the driving frequency according to the digital value;
an off time setting unit to set an OFF time that stops a driving voltage from being applied to the piezoelectric transformer;
a driving voltage generation unit to generate the driving voltage; and
a selection unit to select an output value from the driving frequency control unit or an output value from the off time setting unit according to an output value of the driving voltage generation unit, and to output the selected output value to the driving voltage generation unit,
wherein the driving voltage generation unit generates the driving voltage based on the driving frequency controlled by the driving frequency control unit, the OFF time set by the off time setting unit, and the output value from the selection unit.

2. The apparatus as claimed in claim 1, wherein the output voltage detection unit:
outputs a first digital value if the output voltage is greater than the output control voltage; and
outputs a second digital value if the output voltage is less than the output control voltage.

3. The apparatus as claimed in claim 1, wherein the driving frequency control unit:
increases the driving frequency if the digital value is the first digital value; and
decreases the driving frequency if the digital value is the second digital value.

4. The apparatus as claimed in claim 1, wherein the driving control unit further comprises:
a memory unit to store a frequency range of the driving frequency; and
a frequency range control unit to control the driving frequency to be changed to a value within the stored frequency range.

5. The apparatus as claimed in claim 4, wherein:
if the driving frequency controlled by the driving frequency control unit exceeds the frequency range, the frequency range control unit outputs a control signal; and
the driving frequency control unit stops a change of the driving frequency according to the control signal output from the frequency range control unit.

6. The apparatus as claimed in claim 1, wherein the driving control unit controls an ON time for applying the driving voltage to the piezoelectric transformer by the driving frequency control unit, controls the OFF time by the off time setting unit, and controls a timing for which the ON time and the OFF time is changed in the selection unit so as to control the duty rate.

7. The apparatus as claimed in claim 1, wherein the driving control unit simultaneously controls the driving frequency and the duty rate.

8. The apparatus as claimed in claim 1, further comprising:
a rectifying smoothing unit to rectify and smooth the output voltage of the piezoelectric transformer before outputting the output voltage to the load.

9. An image forming apparatus comprising:
a charging unit to uniformly charge a surface of a latent image supporter;
an exposure unit to form a latent image on the surface of the latent image supporter after charging;
a developing unit to develop the latent image;
a transfer unit to transfer a toner image formed on the latent image supporter to a transfer material; and
a power source apparatus to provide an output voltage of a piezoelectric transformer to at least one of the charging unit, the exposure unit, the developing unit, and the transfer unit, the power source apparatus comprising:
an output voltage detection unit to compare the output voltage of the piezoelectric transformer with an output control voltage, and to output a digital value according to the comparison; and
a driving control unit to control a driving frequency and a duty rate of the piezoelectric transformer according to the digital value,
wherein the driving control unit comprises:
a driving frequency control unit to control the driving frequency according to the digital value;
an off time setting unit to set an OFF time that stops a driving voltage from being applied to the piezoelectric transformer;
a driving voltage generation unit to generate the driving voltage; and
a selection unit to select an output value from the driving frequency control unit or an output value from the off time setting unit according to an output value of the driving voltage generation unit, and to output the selected output value to the driving voltage generation unit,
wherein the driving voltage generation unit generates the driving voltage based on the driving frequency controlled by the driving frequency control unit, the OFF time set by the off time setting unit, and the output value from the selection unit.

10. The apparatus as claimed in claim 9, wherein:
the output voltage detection unit outputs a first digital value if the output voltage is greater than the output control voltage;
the output voltage detection unit outputs a second digital value if the output voltage is less than the output control voltage;
the driving frequency control unit increases the driving frequency if the digital value is the first digital value; and
the driving frequency control unit decreases the driving frequency if the digital value is the second digital value.

11. The apparatus as claimed in claim 9, wherein the driving control unit further comprises:
a frequency range control unit to control the driving frequency to be changed to a value within a predetermined frequency range.

12. The apparatus as claimed in claim 9, wherein the driving control unit controls an ON time for applying the driving voltage to the piezoelectric transformer by the driving frequency control unit, controls the OFF time by the off time setting unit, and controls a timing for which the ON time and the OFF time is changed in the selection unit so as to control the duty rate.

13. The apparatus as claimed in claim 9, wherein the driving control unit simultaneously controls the driving frequency and the duty rate.

14. A piezoelectric transformer type high-voltage power source apparatus, comprising:
a piezoelectric transformer to output an output voltage to a load according to a driving frequency and a duty rate;
an output voltage detection unit to compare the output voltage of the piezoelectric transformer with an output control voltage, and to output a digital value according to the comparison; and
a driving control unit to control the driving frequency and the duty rate of the piezoelectric transformer according to the digital value, wherein the driving control unit comprises:
a driving frequency control unit to control the driving frequency according to the digital value;
an off time setting unit to set an OFF time that stops a driving voltage from being applied to the piezoelectric transformer;
a driving voltage generation unit to generate the driving voltage; and
a selection unit to select an output value from the driving frequency control unit or an output value from the off time setting unit according to an output value of the driving voltage generation unit, and to output the selected output value to the driving voltage generation unit,
wherein the driving voltage generation unit generates the driving voltage based on the driving frequency controlled by the driving frequency control unit, the OFF time set by the off time setting unit, and the output value from the selection unit.

15. The apparatus as claimed in claim 14, wherein the driving control unit controls an ON time for applying the driving voltage to the piezoelectric transformer by the driving frequency control unit, controls the OFF time by the off time setting unit, and controls a timing for which the ON time and the OFF time is changed in the selection unit so as to control the duty rate.

16. The apparatus as claimed in claim 14, wherein the driving control unit simultaneously controls the driving frequency and the duty rate.

17. The apparatus as claimed in claim 1, wherein the driving control unit comprises an up/down counter to increase/decrease a counter value according to the output digital value.

18. The apparatus as claimed in claim 1, wherein the output voltage detection unit comprises a single comparator to control the driving frequency and a driving voltage of the piezoelectric transformer.

* * * * *